United States Patent [19]

Nakach et al.

[11] Patent Number: 4,847,515

[45] Date of Patent: Jul. 11, 1989

[54] STATIC RELAY AND APPLICATION THEREOF TO A BIPOLAR INVERTER OR TO A LOAD IN WHICH A CURRENT FLOWS IN A RANDOM DIRECTION

[75] Inventors: Alain Nakach, Gometz-La-Ville; Jean Sole, Saint Cloud; Pierre Starzynski, Nemours, all of France

[73] Assignee: Commissariat a L'Energie Atomique, Paris, France

[21] Appl. No.: 220,974

[22] Filed: Jun. 22, 1988

Related U.S. Application Data

[63] Continuation of Ser. No. 938,524, Dec. 5, 1986, abandoned.

[30] Foreign Application Priority Data

Dec. 5, 1985 [FR] France ............................... 85 18016

[51] Int. Cl.$^4$ .................... H03K 17/06; H03K 17/08; H03K 17/60; H03K 17/66
[52] U.S. Cl. .................................. 307/255; 307/300; 307/315; 307/257
[58] Field of Search ............... 307/253, 254, 255, 300, 307/315, 257

[56] References Cited

U.S. PATENT DOCUMENTS

| | | | |
|---|---|---|---|
| 3,210,561 | 10/1965 | Ullman | 307/254 |
| 3,646,367 | 2/1972 | Conant, Sr. | 307/255 |
| 4,380,795 | 4/1983 | Lee | 363/131 |

FOREIGN PATENT DOCUMENTS

| | | | |
|---|---|---|---|
| 1537728 | 1/1970 | Fed. Rep. of Germany . | |
| 2521381 | 11/1976 | Fed. Rep. of Germany | 307/255 |
| 1379275 | 10/1964 | France . | |
| 2559322 | 8/1985 | France . | |

OTHER PUBLICATIONS

Electronics, vol. 47, No. 20, 3 Oct. 1974, p. 126, McGraw-Hill, New York, U.S.A.; E. Burwen: "High--Gain Triple Darlington has Low Saturation Voltage".
Electronic Engineering, vol. 38, No. 464, Oct. 1966, pp. 665-667, London, GB; P. Mars: "Analysis of the Complementary Pair Emitter-Follower".
Radio and Electronic Engineer, vol. 54, No. 5, May 1984, pp. 219 and 224, London, GB; D. Colman: "An Advanced Darlington Transistor for Switch Mode Power Control".

Primary Examiner—John Zazworsky
Attorney, Agent, or Firm—Oblon, Spivak, McClelland, Maier & Neustadt

[57] ABSTRACT

The invention relates to a transistorized static relay.

This relay comprises a power amplifier stage having a first bipolar transistor of a first type (npn or pnp), whose collector is connected to the input of the relay and whose emitter is connected to the output of said relay, or vice versa. This relay also has a control stage of the power stage transistor. This control stage comprises at least one bipolar control transistor of a second type (pnp or npn) opposite to the first type, whose emitter is connected to the input or output and whose collector is connected to the base of the transistor of the power stage. The base of the control transistor receives a switching control current interrupting or authorizing the flow of supply current in the load connected to the output of the relay, the impedance of the amplifier stage varying in the reverse direction of the value of the control current and the collector of the low value power transistor is connected to the generator supplying the relay by an impedance.

Application to static relays, to the regulation of the intensity of the current flowing in a load or a bipolar current inverter.

12 Claims, 6 Drawing Sheets

STATIC RELAY AND APPLICATION THEREOF TO A BIPOLAR INVERTER OR TO A LOAD IN WHICH A CURRENT FLOWS IN A RANDOM DIRECTION

This application is a continuation of application Ser. No. 938,524, filed on Dec. 5, 1986, now abandoned.

BACKGROUND OF THE INVENTION

1. Field of the Invention

The present invention relates to a static relay, as well as to the application thereof to a bipolar inverter or to a using circuit in which a current flows in a random direction.

2. Discussion of Background

Figure 1:
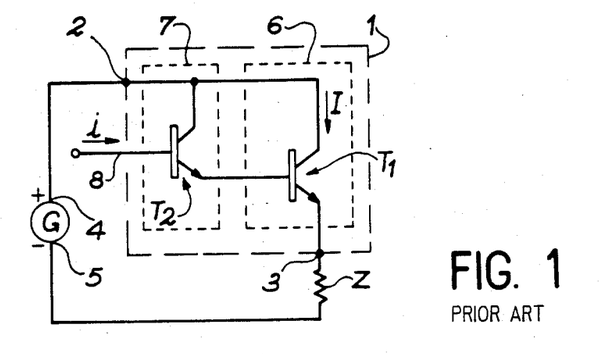
FIGS. 1 to 4, already described, known current amplifiers or relays.

FIG. 1 diagrammatically shows a known circuit making it possible to regulate the intensity value of a current flowing in a load circuit or load (G,Z), by means of a current amplifier stage 1 comprising a current input and output 2, 3 respectively. The output of amplifier 1 is connected to a first terminal of load Z. The current is supplied by a generator G having a first supply terminal 4 connected to the amplifier input 2 and a second supply terminal 5 connected to a second input of load Z. This known amplifier (DARLINGTON circuit) generally comprises a power amplifier stage 6 constituted by a transistor T1, e.g. of the npn type, whose collector is connected to the amplifier input 2 and whose emitter is connected to the amplifier output 3. This amplifier also comprises a stage 7 for controlling transistor T1 of the power stage. This bipolar control transistor is of the same type as the transistor of the power stage (npn in the considered example). The collector of power transistor T2 is connected to the amplifier input 2, whilst the emitter of said transistor is connected to the base of the power transistor T1. The base 8 of transistor T2 receives a current of intensity i making it possible to control the value of the current I flowing in load Z. It is assumed that the supply terminal 4 of generator G is a positive voltage terminal, whilst terminal 5 is a negative voltage terminal.

In this known type of current amplifier, the power and control transistors are of the same type. This type of amplifier has serious disadvantages. When the power transistor T1 is in the saturated state, the potential drop between the input and output terminals 2, 3 of the amplifier (potential drop between the emitter and collector of power transistor T1) is greater than that normally appearing between the emitter and the collector of said transistor when its base is not connected to another transistor for forming a Darlington circuit. Thus, this type of amplifier cannot function correctly if it is wished to use is as a relay.

Figure 2:
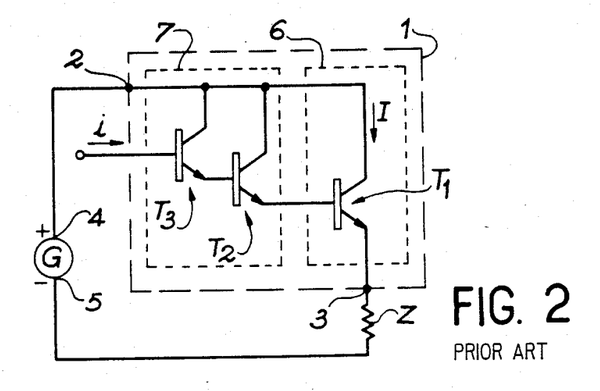

This potential drop becomes even greater when several Darlington stages are connected in cascade, as is diagrammatically shown in exemplified form in FIG. 2. The same elements carry the same references in FIG. 2 as in FIG. 1. In this known circuit amplifier 1, whose input and output terminals are designated 2, 3 comprises a power stage 6 constituted by a power transistor T1, whose collector is connected to the input 2 (positive terminal 4 of generator G) and whose emitter is connected to load Z, itself connected to the negative terminal 5 of generator G. This amplifier also comprises a control stage 7 constituted by a Darlington circuit with two transistors T2, T3 connected in cascade. In this type of circuit, the potential drops between the emitter and the base of each transistor of the control stage are added to one another, so that between the base and collector of the power stage transistor T1 there is a voltage at least equal to the sum of these potential drops. Thus, transistor T1 cannot function at its saturation maximum. As the largest fraction of the current I supplying load Z passes through transistor T1 and as the Joule effect in the transistor T1 is equal to the product of the current passing through it by the emitter-collector voltage drop, in the junctions of transistor T1 there is a considerable Joule effect for high values of current I.

Moreover, in a Darlington circuit, the base-emitter potential difference of the power transistor T1 is reduced as a result of the supplementary voltage drop introduced by control transistor T2 and is further reduced by the presence of transistor T3 (and transistors of preceding stages, if applicable). Thus, the power transistor is not generally well saturated, so that this circuit, like the preceding one cannot function correctly as a relay.

Figure 3:
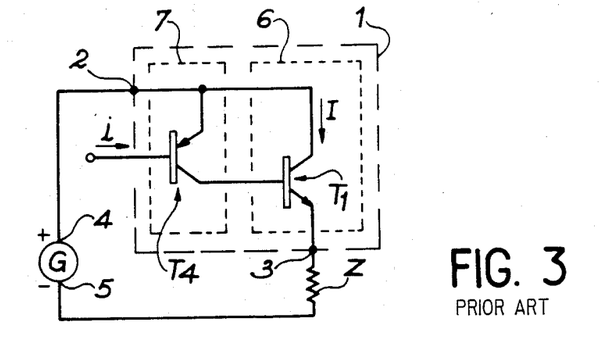

FIG. 3 diagrammatically shows another known type of current amplifier 1 able to serve as a relay. This amplifier has an input 2 and an output 3, the latter being connected to a first terminal of a load Z. The current is supplied by a generator G having a first positive supply terminal 4 connected to the amplifier input 2 and a second negative terminal 5 connected to another terminal of load Z. This amplifier comprises a power amplifier stage 6 having a bipolar transistor T1 of a first type (e.g. npn). The collector of this transistor is connected to the amplifier input 2 and its emitter is connected to the amplifier output 3. This amplifier also comprises a stage 7 for controlling the transistor of the power stage, said control stage being constituted by at least one bipolar control transistor T4. This transistor T4 is of a second type (e.g. pnp), opposite to the first type. The emitter of transistor T4 is connected to the amplifier input 2 and the collector of said transistor is connected to the base 10 of power transistor T1. The base of control transistor T4 receives a control current i, which determines the intensity of the supply current I of load Z. The impedance of the amplifier stage varies in the reverse direction of the value of the control current, as will be shown hereinafter. In this circuit, each transistor is supplied by the entire potential difference between input 2 and output 3 of the amplifier, less a single emitter-base voltage drop for all the control transistors. Thus, in the case of FIG. 3, the emitter-base potential difference of power transistor T1 is deducted from the potential difference supplying the emitter-collector junction of control transistor T4. Said circuit type can function as a relay. However, the operation of the power transistor under saturation conditions is not perfect.

Figure 4:
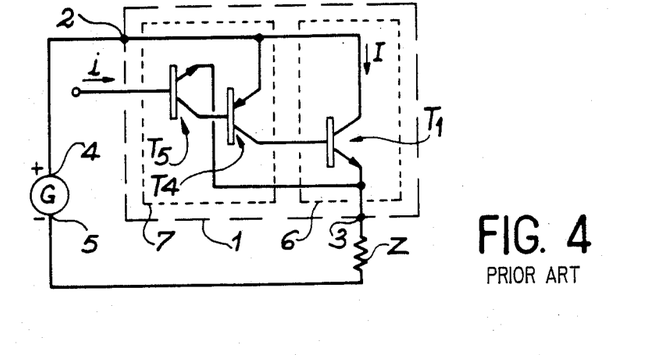

FIG. 4 diagrammatically shows a variant of the preceding circuit, which can also serve as a relay. The same elements carry the same references in both FIGS. 4 and 3. The amplifier or relay 1 here comprises a power amplifier stage 6 constituted by an e.g. npn transistor T1. The amplifier also comprises a control stage 7 of the transistor T1 of the power stage. The control stage 7 here comprises two transistors T5, T4 of alternate types. Transistor T4 is of the pnp type (because transistor T1 is e.g. of the npn type), whilst transistor T5 is of the npn type. The collector of transistor T4 is connected to the base of transistor T1 and the collector of transistor T5 is connected to the base of transistor T4.

The emitter of the transistor T4 is connected to the positive terminal 4 of generator 5, and the emitter of this transistor T5 is connected to the output 3 of the amplifier. This type of circuit prevents the accumulation of the emitter-base voltage drops observed in the aforementioned Darlington circuit. However, as in the circuit of FIG. 3, the power transistor does no operate perfectly under saturation conditions.

SUMMARY OF THE INVENTION

The object of the present invention is to obviate the disadvantages of circuits able to function as a relay and in particular reduce any heat dissipation in the junctions of the power transistor of said relay. It also aims at improving the operation of said power transistor, particularly under saturation conditions. These objectives are achieved by using at least one control transistor for controlling the intensity of the current supplied by the power transistor and said two transistors are of opposite types and more particularly by introducing a resistor or diode in series in the collector of the power transistor. As will be shown hereinafter, this makes it possible to further decrease the emitter-collector potential drop of the power transistor, particularly when the latter functions in saturation.

The present invention therefore specifically relates to a relay authorizing or stopping the flow of a current in a using circuit comprising a power stage having at least one bipolar power transistor of a first type (npn or pnp), whose emitter is connected to a first terminal of the using circuit and whose collector is connected to a second terminal of the using circuit, and an amplifier stage for controlling the power transistor for authorizing or interrupting the flow of current in the using circuit, said amplifier stage having at least one bipolar control transistor of a second type (pnp or npn) opposite to the first type and whose emitter is connected to the second terminal of the using circuit and whose collector is connected to the base of the power transistor, the base of the control transistor receiving a control current determining the intensity of the supply current of the using circuit, the impedance of the power stage varying the reverse direction to the value of the control current, wherein the collector of the transistor of the power stage is connected to the second terminal of the using circuit by a low value impedance chosen so that the collector-base junction of the power transistor is polarized in the forward direction, at saturation.

According to another feature, said impedance is a resistor or diode, whose conduction direction is the same as that of the collector-emitter junction of the power stage transistor.

According to another feature, a diode connects the collector and emitter of the power transistor, said diode being connected in reverse manner with respect to the direction of the current in the power transistor.

According to another feature, a high value resistor connects the base and emitter of the power stage transistor for fixing the base-emitter voltage of the power transistor when the transistor of the control stage is in the off state.

The term "high value resistor" is understood to mean a resistor such that the current which it deflects is low compared with the emitter-base current of the corresponding transistor, when the latter is on.

According to another feature, the control stage has at least one further bipolar transistor of a first type (npn or pnp), whose collector is connected to the base of the control transistor and whose emitter is connected to the first terminal, a high value resistor optionally connecting the base and emitter of the control transistor, the control current being applied to the base of said other bipolar transistor.

According to another feature, another high value resistor connects the base and emitter of the other bipolar transistor of the first type of the control stage.

According to another feature, the control stage transistor is a phototransistor, whose base and emitter are connected by a high value resistor.

According to another feature of another embodiment, the power stage has at least one second power transistor connected in parallel with the power transistor connected to the load circuit, said second power transistor having its emitter connected to the second terminal of said using circuit and its collector connected to the first terminal of the generator by a low value impedance chosen so that the collector-base function of said second power transistor is polarized in the forward direction, the base of each power transistor being connected to the collector of the control transistor.

According to another feature of this embodiment, a high value resistor connects the bases and emitters of the power transistors.

According to another feature of this embodiment, the base of each power transistor is connected to the collector of the control transistor by a resistor.

The invention applies to a bipolar current inverter in a load, said inverter having four relays according to the invention located respectively in four branches of a bridge, the load being located in a diagonal of the bridge and the generator being located in another diagonal of the bridge.

The invention also applies to a load in which an alternating current or a random direction current flows, the relays of the invention being connected between two terminals of a diagonal of a four diode rectifier bridge, a random direction current generator or an a.c. voltage generator being connected in series with the load between two other terminals of another diagonal of the rectifier bridge.

BRIEF DESCRIPTION OF THE DRAWINGS

The invention is described in greater detail hereinafter relative to non-limitative embodiments and the attached drawings, wherein show.

DESCRIPTION OF THE PREFERRED EMBODIMENTS

Figure 5:
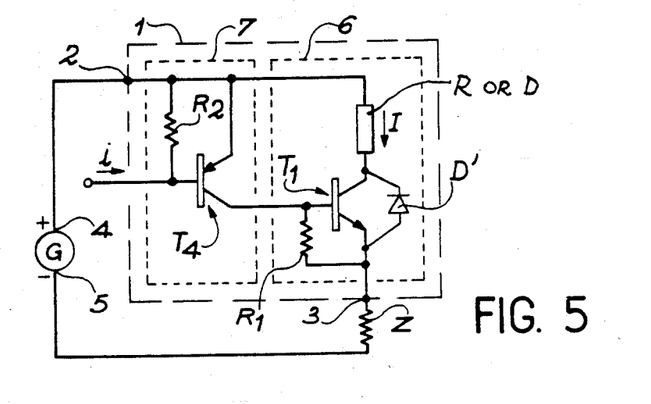
FIG. 5 different variants of an embodiment of the relay according to the invention.

FIG. 5 diagrammatically shows an embodiment of the relay according to the invention for different variants thereof. The same elements carry the same references here and in FIG. 3. In this embodiment, the relay has a power stage 6, more particularly having a power transistor T1 of a first type (e.g. npn), as well as a control stage 7 more particularly having a control transistor T4 of a second type (e.g. pnp). The collector of power transistor T1 is, according to the invention, connected to a first terminal 4 of generator G by a low value impedance to be described in greater detail hereinafter. The emitter of the power transistor is connected to a terminal 3 of the load circuit or load Z. Another terminal of this load circuit is connected to a second terminal 5 of generator G. It is assumed that the first terminal 4 of this generator is positive, whereas the second terminal 5 is negative. The emitter of control transistor T4 is connected to the first terminal 4 of the generator, whilst the collector of said transistor is connected to the base of the power transistor T1. The base of control transistor T4 can receive a control current i from the current I flowing in load Z.

According to the invention, the operation of the relay is improved as a result of the low value impedance connecting the collector of the power transistor to the first terminal of the generator. As a result of this impedance, the power transistor T1 functions better under saturation conditions, as will be shown hereinafter. According to two different variants, said impedance can either be constituted by a low value resistor R, or by a diode D, whose conduction direction is that of the current in the transistor T1 of the power stage. This low value impedance introduces a low potential drop on the collector of power transistor T1 and consequently said transistor is polarized by an emitter-base potential difference greater than the emitter-collector potential difference. Thus, in this case, the emitter-base potential difference of the power transistor T1 is equal to the emitter-collector potential difference of said transistor, increased by the potential drop introduced by the low value impedance. This leads to a better saturation of transistor T1, which brings about a smaller emitter-collector potential drop of said transistor and therefore a reduction in the Joule effect in transistor T1. However, a Joule effect appears in resistor R or in diode D, but this Joule effect is not disturbing because it is easy to dissipate. In this case there is no limitation to as small a temperature rise as that which must not be exceeded in a semiconductor junction to prevent destruction of the latter. For resistors, it is possible to allow much greater temperature rises without any danger of damaging these. In the case where the low impedance is a resistor R, it is possible to find an optimum value for the same.

According to a variant of the embodiment described relative to FIG. 5, a diode D' connects the collector and emitter of power transistor T1. This diode is connected in reverse with respect to the direction of the current in the transistor. This diode makes it possible to protect the power transistor against any reverse direction current.

According to another variant of the embodiment of FIG. 5, a high value resistor R1 connects the base and emitter of transistor T1 of the power stage, said resistor making it possible to fix the base-emitter voltage of said transistor T1, when the transistor T2 of the control stage is in the off state. In the same way, a high value resistor R2 makes it possible to connect the base and emitter of transistor T2 of the control stage for fixing the base-emitter voltage of said transistor.

With the aid of FIG. 6, a more detailed explanation will now be given of the function of the low impedance which, according to the invention is introduced on the collector of the power transistor T0, assumed to be of the pnp type in the represented embodiment. A junction transistor is constituted by two consecutive junctions emitter-base and base-collector in the reverse direction. The pnp transistor shown normally functions by polarizing the emitter-base junction in the forward direction (the voltage drop at the terminals of said junction is low) and the base-collector junction in the reverse direction (the voltage drop at the terminals of said junction is high).

In this operation, on increasing the base current (in reality it is the emitter-base current because the base-collector junction is reverse polarized), there is a time when the collector current virtually no longer increases. It is said that the transistor is saturated. In this case the emitter-collector voltage become relatively small.

If, for polarizing the base, there is no other current source or voltage source than the emitter and collector terminals of the actual transistor (case of a relay), a base current of maximum value is obtained by bringing in the best possible way the potential of the base to the potential of the collector using a connection connecting the base and the collector.

Figure 6:
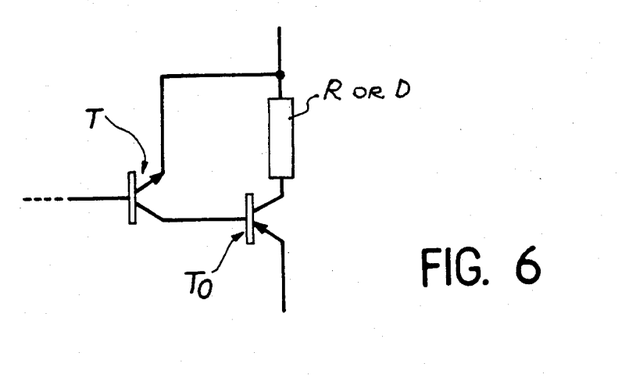
FIGS. 6 and 7 provide a better understanding of the operation of the relay according to the invention.

This connection can be put in place or interrupted by means of a mechanical switch, or by means of another transistor T connected in the manner shown in FIG. 6, which is made to function in saturated manner (switch closed) or blocked manner (switch open). In this case, the voltage at the terminals of the base-collector junction of transistor T0 is equal to the voltage at the terminals of transistor T.

It is possible to further decrease this base-collector voltage of transistor T0 by polarizing the base-collector junction in the forward direction. For this purpose it is necessary to introduce an impedance (resistor R or diode D in the forward direction) in series with the collector of transistor T0 and bring the potential of the base of said transistor to the potential of the point furthest from said impedance. In consequence of this impedance, the base-collector junction of transistor T0 is then polarized in the forward direction when transistor T0 is saturated. This transistor works on an unusual manner.

The base-collector voltage then becomes very low, which reduces the Joule effect on said junction. The small voltage drop at the terminals of the impedance (R or D) then brings about a weak Joule effect in said impedance which can be dissipated out of transistor T0 with a smaller cooling surface than would have been necessary on said transistor to dissipate the same heat because the temperature of a resistor or diode can safely be raised to a much higher value than that which must not be exceeded in the junction of the transistor (to avoid destruction thereof).

The above reasoning also applies in the case of a npn transistor.

Figure 7:
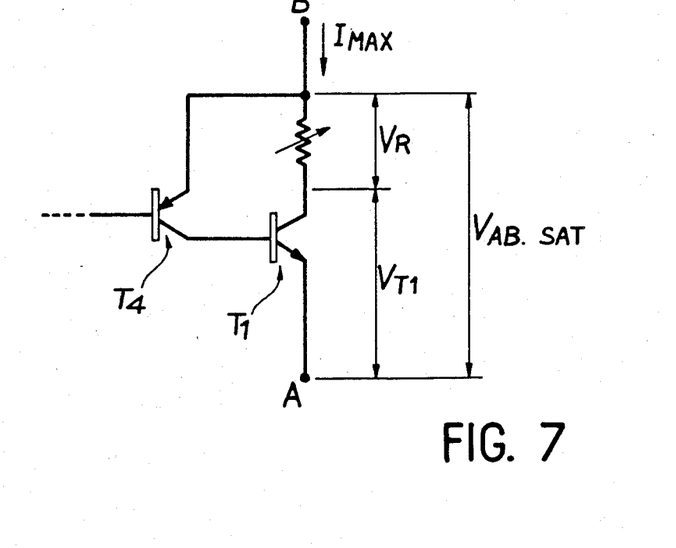

The optimization of the value of resistor R connected to the collector of power transistor T1 will be better understood with the aid of the circuit according to FIG.

7, in which is a variable resistor for the requirements of the calculation.

For R=0, the voltage at the terminals of the saturated relay is measured ($V_{AB.SAT}$) for the current $I_{max}$ corresponding to the maximum permitted heating of transistor T1. (For R=0 the base-collector junction of transistor T1 is then reverse polarized). The value of R is increased to the highest possible level which, for the same current $I_{max}$, makes it possible to retain the order of magnitude of the voltage $V_{AB.SAT}$ between terminals A and B.

$V'_{AB}$ is obtained equal to or very slightly higher than $V_{AB.SAT}$. The emitter-collector voltage of transistor T1 is then $V_{T1} \leq V'_{AB.SAT}$ (and the base-collector junction of T1 is then polarized in the forward direction.) A large fraction of the voltage $V'_{AB.SAT}$ (generally close to 50%) is then transferred to the terminals of resistor R. The corresponding calorific power is then transferred t resistor R from transistor T1.

The considerable decrease of the calorific power dissipated in transistor T1 then makes it possible either to increase current $I_{max}$ (on not exceeding the current limit of the transistor used) and it is of interest to slightly improve the value of R in this case, or reduce the dimensions of the radiator of T1, or choose a combination of these two possibilities.

Figure 8:
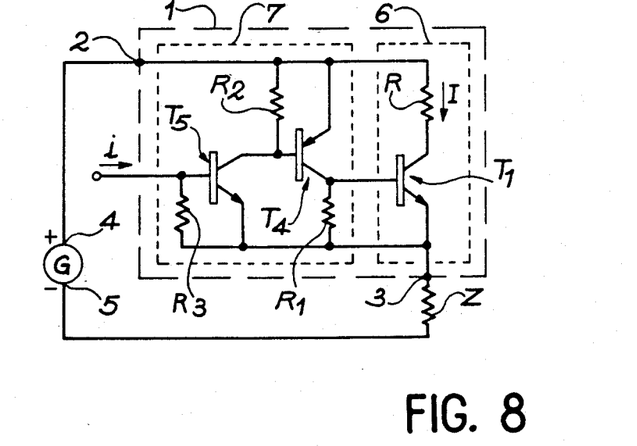
FIGS. 8 and 9 diagrammatically show other embodiments of a relay according to the invention.

FIG. 8 diagrammatically shows another embodiment of the relay according to the invention. The same elements carry the same references in FIG. 8 as in FIG. 5. In this embodiment relay 1, whose input and output terminals are designated 2 and 3, comprises a power stage 6. The latter is constituted by transistor T1, whereof the collector is connected to the input 2 of the relay by a low value resistor R and whereof the emitter is connected to a terminal of the load or load circuit Z. Transistor T1 is of a first type (e.g. npn). Generator G has a first positive terminal 4 connected to the amplifier input 2, whilst the second negative terminal 5 of said generator is connected to another terminal of load Z. The relay also comprises a control stage 7 which, in this embodiment, comprises two cascade-connected transistors T4, T5 of alternate complimentary types. Thus, in the example shown here, if transistor T1 is of the npn type, the control stage transistor T4 preceding transistor T1 is of the pnp type, transistor T5 preceding transistor T4 being of the npn type. For the reasons given hereinbefore, a resistor R1 connects the base and emitter of power transistor T1, a resistor R2 connects the base and emitter of transistor T4, a resistor R3 connects the base and emitter of transistor T5 and a low value resistor R or a not shown diode connects the collector of transistor T1 to the input 2 of the amplifier. As stated hereinbefore, said resistor or diode is intended to introduce a small voltage drop on the collector of power transistor T1. In this circuit, transistors of complimentary types alternate. The number of transistors of complementary types in the power and control stages has been limited to three in the drawing. It is obvious that this number can be much larger and is essentially dependent on the current gain which it is wished to obtain (said current gain being the ratio I/i, I being the current flowing in load Z and i the control current applied to the base of control transistor T5). Each of the transistors, other than T1 is always supplied by the potential difference between input 2 of the relay and output 3 thereof, reduced solely by the single emitter-base potential drop of the controlled transistor. No matter what the number of transistors forming the relay, the voltage appearing on saturation between the input and output thereof is independent of the number of transistors. Thus, the aforementioned Joule effect is not modified, which is not the case in the aforementioned cascade-type Darlington amplifier circuit.

The control current i can be supplied by any random generator type. All the transistors are supplied by all the current I supplied by generator G, so that all said current passes through load Z. This relay can be inserted at any random point in any random electric circuit, without requiring any modification of the latter, because it does not require a clearly defined voltage supply in order to operate. It has no lower limit for the voltage or current values to be controlled. It functions down to a zero current I, which is not the case of known relays, and particularly Darlington type circuits. The circuit of said relay can be called "floating", because it does not require a fixed potential with respect to a reference earth or ground. When it functions in the switching mode, it can also replace electromechanical relays. It makes it possible to obtain a current gain of any desired high level because the ratio I/i between the current I supplied to the load and the control current i is only dependent on the number of cascade-connected transistors. When the transistors are saturated, the energy dissipated in the form of heat is below that which would be dissipated by a Darlington circuit because, the polarities of the transistors used being in alternating form, the voltage drops in the transistors are not added to one another, each transistor instead using all the potential difference appearing at the terminals of power transistor T1, as well as resistor R or diode D, less the single emitter-base potential drop of the transistor which is controls. Most of the energy dissipated in heat form is dissipated into the low value impedance connecting the collector of the power transistor T1 to the input of the relay, as indicated hereinbefore. This impedance allows much greater temperature rises than those allowed by semiconductor junctions.

It is of interest to mention that the base current i of the first control transistor can be produced by a light beam. It is merely necessary in this case to replace the first control transistor by a phototransistor without changing anything in the circuit which behaves in the same way. This type of circuit is diagrammatically shown in FIG. 9. The same elements carry the same references in FIGS. 9 and 8. The first transistor T5 of the control stage is a phototransistor which, when illuminated, supplies the control current i.

Figure 9:
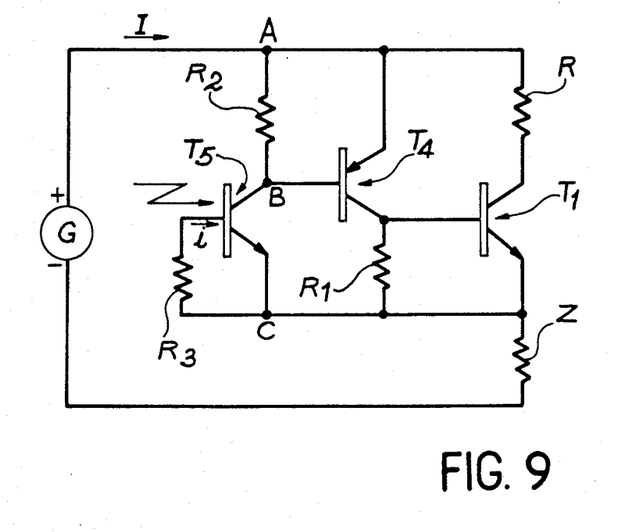
Figure 10:
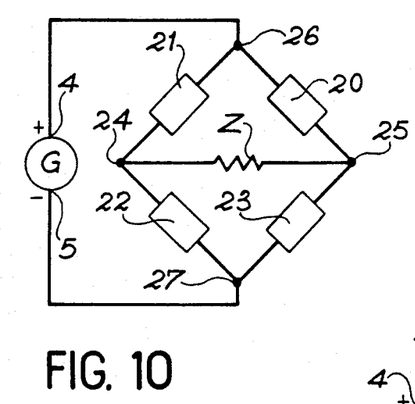
FIG. 10 diagrammatically shows a bipolar inverter circuit using relays according to the invention.

FIG. 10 diagrammatically shows a bipolar current inverter in a load Z. This bipolar inverter comprises four relays 20, 21, 22, 23 according to the invention respectively arranged in the four branches of a bridge. Load Z is connected in a diagonal of the bridge between two terminals 24, 25 thereof. The generator G is connected by its positive and negative terminals 4, 5 to two other terminals 26, 27 of another diagonal of the bridge. Relays 20, 21, 22, 23 are identical to one of the relays of FIGS. 5, 8 and 9 described hereinbefore. If a control current is applied to the first transistor of the control stage of each of the relays 21 and 23 for example, it is possible to saturate the corresponding transistors (transistors which are off when no current is applied). Everything then happens as if the terminal 24 to which the load is connected was connected to the positive pole 4 of generator G and terminal 25 of the bridge to which is connected the load was connected to the negative pole 5 of the generator. Conversely, by applying a control current to the base of the first transistor of the control stage of each of the relays 20, 22, everything happens as if terminal 24 to which is connected load Z was connected to the negative pole 5 of generator G and as if terminal 25 of the bridge to which is connected the load was connected to the positive pole 4 of generator G. Thus, the device functions like an inverter of the direction of the current flow through load Z. If no current is applied to the bases of the control transistors of each relay, load Z is not energized, so that the inverter is a three-state inverter.

Figure 11:
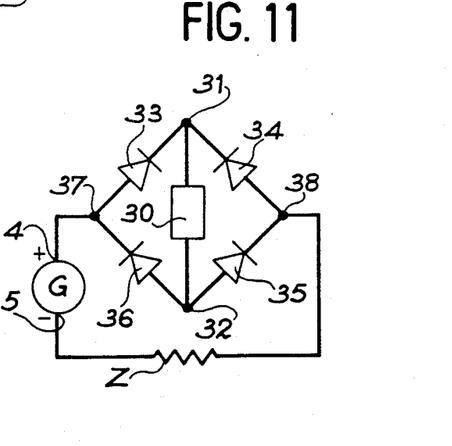
FIG. 11 diagrammatically shows a circuit permitting the circulation of a random direction current in a load using a relay according to the invention.

FIG. 11 diagrammatically shows a circuit in which a relay 30 according to the invention (one of the relays of FIGS. 5, 8 and 9) is used for making flow in load Z and alternating current or a random direction current. Relay 30 is connected between two terminals 31, 32 of a diagonal of a four-diode 33, 34, 35, 36 rectifier bridge. A generator G of a random direction current or alternating current voltage is connected in series with load Z, between two other terminals 37, 38 of another diagonal of the rectifier bridge. In this circuit, although the current supplied by generator G is in a random direction or the voltage supplied by it is alternating, relay 30 is traversed by a current with a constant direction, whilst load Z is traversed by a current with a variable direction.

It is pointed out that each of the circuits shown has a npn power transistor. The circuits according to the invention can be realized with pnp power transistors and in this case the low value impedance R or D connects the collector of transistor T1 to output 3, its emitter being connected to input 2.

It is pointed out that the potential drop obtained in this way at the terminals of the power transistor, and consequently the Joule effect, is much weaker (factor ranging between 3 and 5) than with a field effect power transistor.

The interest of the invention is that it is possible to obtain the desired current gain by alternating the number of transistors necessary without any deterioration to the interesting properties of the relay and its correct functioning suffering any deterioration (which would not be possible with cascade-type Darlington circuits). Current gains close to those obtained with field effect transistor relays are possible. Furthermore, no matter what the number of transistors connected in this way, each of these transistors is supplied by the potential difference appearing a the terminals of the power transistor (increased by that at the terminals of resistor R or diode D), less the single emitter-base potential drop of the directly controlled transistor. Thus, no matter what the number of control transistors, the potential difference at the terminals of the power transistor (and therefore the Joule effect) does not increase, as a result of a possible poor functioning of the transistors controlling the same. All the transistors function correctly up to a zero current I, without it being necessary to call on a supplementary external supply. For example, a circuit with thyristors no longer functions at 1/10 of the maximum current thereof.

The fact of being able to obtain the desired current gain obviates the use of an external current amplifier, which would then require a supplementary supply and would cause problems of connections (common earth or ground, etc.).

Figure 12:
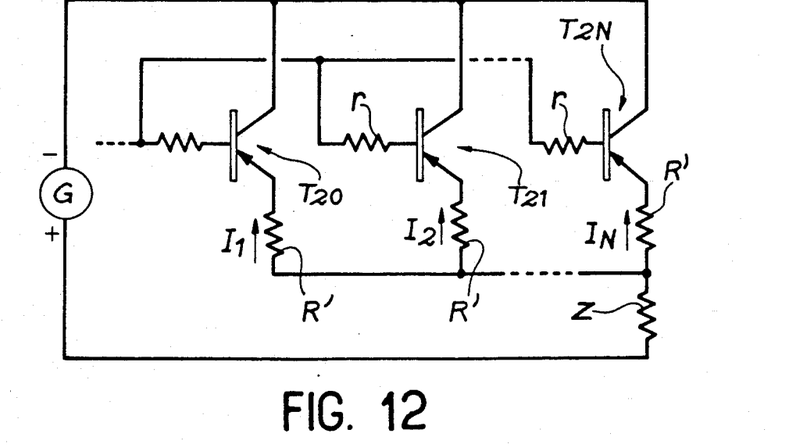
FIG. 12 a relay in which power transistors are connected in parallel.
Figure 13:
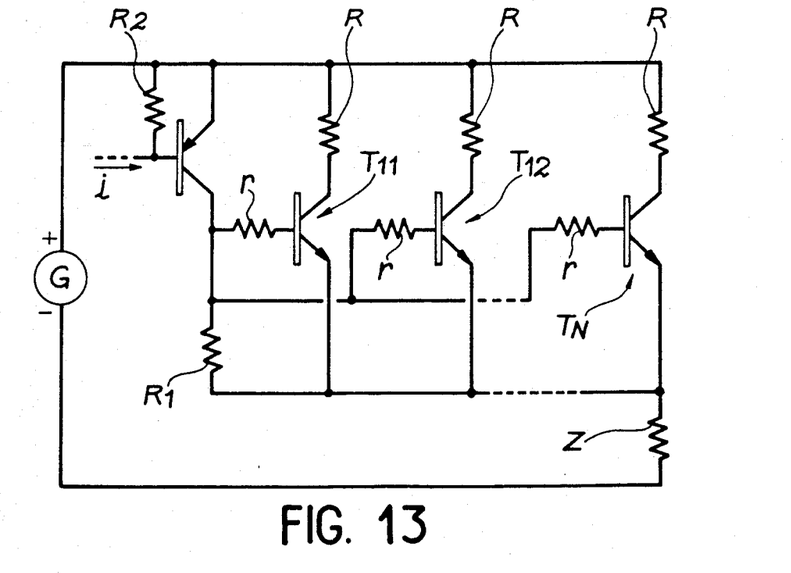
FIG. 13 diagrammatically a relay according to the invention, in which the power transistors are connected in parallel.

FIGS. 12 and 13 give a better understanding how, with the aid of the invention, it is possible to obtain a floating static relay for high currents. FIG. 12 shows a static relay for high currents, as it could be imagined by a specialist. Only the power stage connected to generator G is shown.

The maximum currents which can be withstood by the power transistors are limited, so that the solution for switching higher currents is to connect several power transistors in parallel T21, T22, ... T2N. Unfortunately, it is known that the operation of junction transistors in parallel is relatively unstable, unless the precaution is taken of introducing on each of these transistors a negative current feedback making it possible to balance in a stable manner the distribution of currents I1, I2, ... In between the different transistors. Generally the solution used consists of introducing on each transistor a resistor R' in series with the emitter. It stabilizes the system by reducing the emitter-base current (by reducing the emitter-base potential difference) for transistors, in which the current would have a tendency of being highest. It is also possible to introduce a resistor r in series with the base of each transistor.

FIG. 13 shows how it is possible, according to the invention, to directly connect several power stages in parallel, without being necessary to introduce resistors in series, particularly with the emitters of the transistors T11, T12, TN of the power stage. Thus, the resistors R in series on the collectors, according to the invention, have a stabilizing function identical to the distribution of the current between the different transistors when the latter are saturated at the point where the two emitter-base and collector-base junctions are polarized in the forward direction, because in this case the voltage drops at the emitter-collector terminals of the power transistors are extremely small and the currents flowing through these transistors are essentially determined by the resistors R in series on the collectors. The system is stable: if current IN tends to increase in transistor TN for example, the voltage drop R.IN at the terminals of resistor R will increase, reducing the voltage available at the emitter-collector terminals of said transistor and consequently reducing the current through the transistor. This leads to a stable distribution of the total current I between the different power stages in parallel.

Within the scope of the invention, e.g. in simple manner a 30 Ampere (A) relay is obtained by connecting in parallel three 10A power stages without modifying the latter. It is merely necessary for the control transistor T2 to be able to supply an adequate current for supplying the three bases, in parallel, of power transistors T11, T12, TN.

It is possible in this case to introduce emitter-base resistors such as R1. For fixing in the off state, the base potential with respect to the emitters of each of the transistors T11, T12, TN in parallel, it is merely necessary to have a single resistor R1. In practice, said single resistor is given a value three times lower than that which would have been used on a single power transistor in the case where three power transistors are connected in parallel.

Apart from the fact that this connecting in parallel of three 10A power stages makes it possible to produce a static floating 30A relay with transistors able to withstand a maximum of 10A, each of the three power stages connected in parallel is only traversed by a 10A current and the voltage drop at the terminals of the 30A relay is the same as that at the terminals of a 10A relay.

Consideration has been given here to the example of three power stages in parallel. According to this process, it is possible to consider a relay having N power stages in parallel (with N≧2), able to reach high values, e.g. N=10 or higher. In this latter case the control transistor must be sufficiently powerful to supply all the bases in parallel. It is also possible to use several control transistors, as shown e.g. in FIGS. 8 and 9. It is also possible to provide a resistor R for reducing the emitter-base current in each power transistor.

The relays according to the invention described hereinbefore can be called "working" contact relays, the contact being "closed" when the relay is energized. The so-called "rest" contact corresponds to the "closed" contact when the relay is not energized.

According to the invention, on the basis of the aforementioned "working" contact relays, it is possible to obtain "rest" contact relays, the contact being closed when the relay is not energized. It is known that it is possible to obtain a reverse function by simply reversing the control signal of the relay.

However, there are cases of using relays where it is of much greater interest to directly have relays with a "rest" contact without it being necessary to reverse the control signal. Such cases may e.g. be necessary in security devices, where it may be indispensible to have "rest" contacts in the case of an interruption or failure of the relay control circuit.

The invention makes it possible to obtain a "rest" contact relay on the basis of the aforementioned "working" contact relays using the modifications described hereinafter.

On considering the relay shown in FIG. 9, the resistor R2 connected between points A and B to the emitter-base terminals of transistor T4 makes it possible to block said transistor T4, when phototransistor T5 is not excited (T5 non-conductive). As T4 is blocked or off, resistor R1 blocks T1 and consequently, without energizing, the relay corresponds to an "open" contact.

Figure 14:
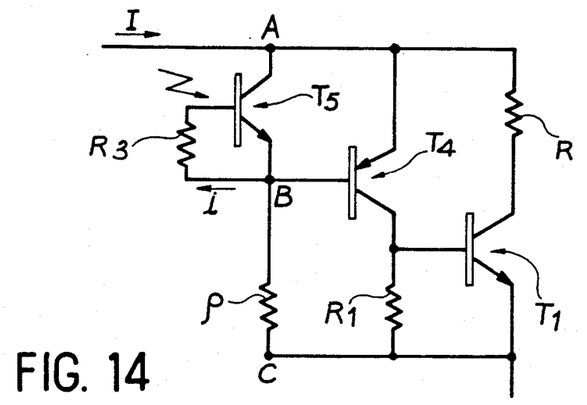
FIGS. 14 and 15 other variants of the relay according to the invention shown in FIG. 9.
Figure 15:
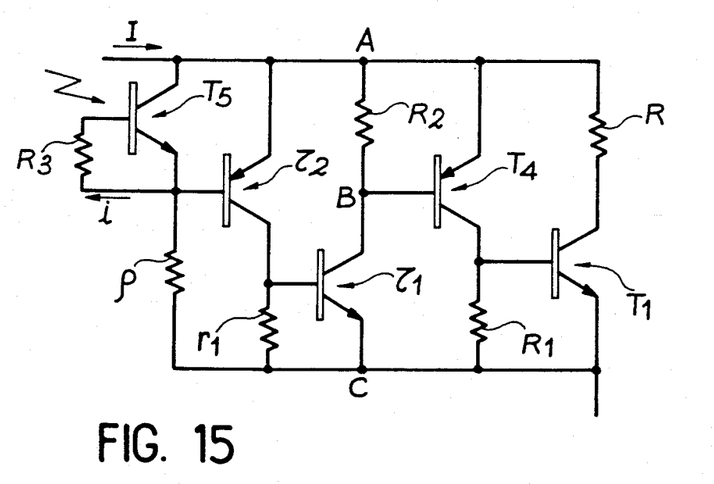

According to the invention and as shown in FIG. 14, resistor R2 of FIG. 9 is replaced by phototransistor T5 equipped with resistor R3 and a resistor ρ is introduced between points B and C. When T5 is not excited, it is blocked by its resistor R3 and the emitter-base junction of T4 is energized by the voltage at the terminals of R and T1 across resistor ρ. T4 then becomes conductive and in turn T1 becomes conductive. Thus, when T5 is not excited, the relay is equivalent to a "closed" contact and thus forms a "rest" contact.

However, on exciting T5, the latter becomes conductive and short-circuits the emitter-base junction of transistor T5 to an adequate extent to block T4, which blocks T1 and the relay behaves like an "open" contact. The "open" and "closed" states have been reversed compared with FIG. 9.

FIG. 14 shows the practical realization of the relay of FIG. 14. Thus, in FIG. 14, when T5 is excited, on the one hand the relay behaves like an "open" contact, i.e. all the electromotive force of generator G (FIG. 1) is transferred to the terminals of R and T1 and therefore to terminals AC in FIG. 14 and on the other hand T5 is conductive, said electromotive force then being transferred to the terminals of ρ. Thus, a current flows through ρ and corresponds to a leakage current of the relay in the "open" state.

To reduce this leakage current, the value of ρ is increased (e.g. ρ=15M Ω for a 150 V relay, which will give a leakage current of 10 μA).

However, with such values of ρ, when T5 is not excited (T5 non-conductive), the base current of T4 is very low and does not make it possible to saturate T4, so that it is not possible to saturate T1.

To solve this problem, it is sufficient (for ρ=15M Ω) to add between ρ and T5 on the one hand and T4 on the other, two amplifier states (transistors T1 and T5 particularly) of the aforementioned type supplied by the potential difference appearing at the terminals of R and T1. This gives a "rest" contact relay, which functions absolutely correctly. As a function of whether T5 is excited or not, a blocking or a correct saturation of T1 is obtained. There is no need to introduce other correcting elements into this circuit, which is sufficient in itself.

Combinations of relays having "rest" contacts and "working" contacts can be effected in the circuit of FIG. 10.

What is claimed as new and desired to be secured by letters patent of the United States is:

1. A relay authorizing or stopping the flow of a current in a using circuit comprising a power stage having at least one bipolar power transistor of a first type, whose emitter is connected to a first terminal of the using circuit and whose collector is connected by a low value impedance to a second terminal of the using circuit, and an amplifier stage for controlling the power transistor for authorizing or interrupting the flow of current in the using circuit, said amplifier stage including:

at least one bipolar control transistor of a second type opposite to the first type and wherein one of said at least one bipolar control transistor of the second type has its emitter connected to the second terminal of the using circuit and its collector connected to the base of the power transistor, a high value resistor connecting the base and emitter of the power stage transistor, the value of this high value resistor being selected in order to maintain at a constant value the base-emitter voltage of the power transistor when the transistor of the amplifier stage is in the off state, so that a supply of power to the amplifier stage is constituted by the connection of the amplifier stage to the first and second terminals of the using circuit, the base of the control transistor receiving a control current determining the intensity of the current circulating in the using circuit, the impedance of the power stage varying in the reverse direction to the value of the control current, the low value impedance being chosen so that the collector-base junction of the power transistor is polarized in the forward direction, at saturation.

2. A relay according to claim 1, wherein the impedance is a resistor or diode connected so as to function in the forward direction.

3. A relay according to claim 2, wherein a diode connects the collector and emitter of the power transistor, said diode being connected in reverse compared with the direction of the current in said power transistor.

4. A relay according to claim 1, further including at least one other bipolar transistor of a first type (npn or pnp), whose collector is connected to the base of the control transistor and whose emitter is connected to said first terminal, a high value resistor being optionally connected to the base and emitter of the control transistor, the control current being applied to the base of said other bipolar transistor.

5. A relay according to claim 4, wherein another high value resistor connects the base and emitter of the other bipolar transistor of the first type of the control stage.

6. A relay according to claim 1, wherein another one of said at least one bipolar control transistor is a phototransistor.

7. A relay according to claim 1, wherein the power stage has at least one second power transistor connected in parallel with the power transistor connected to the using circuit, said second power transistor having its emitter connected to the first terminal of the using circuit and its collector connected to the second terminal of said using circuit by a low value impedance chosen so that the collector-base junction of said second power transistor is polarized in the forward direction at saturation, the base of each power transistor being connected to the collector of the control transistor.

8. A relay according to claim 7, wherein a high value resistor connects the bases and emitters of the power transistors.

9. A relay according to claim 7, characterized in that the base of each power transistor is connected to the collector of the control transistor by a resistor.

10. A relay according to claim 1, wherein the amplifier stage comprises at least another bipolar transistor connected between the emitter and the base of said one control transistor.

11. A bipolar current inverter for inverting a current circulating in a load, said inverter comprising four relays according to any one of the claims 1 to 2 and 4–10, respectively connected so as to constitute four branches of a bridge, the load being connected to the relays in a diagonal of the bridge and the generator being connected to the relays in another diagonal of the bridge.

12. A relay according to any one of the claims 1 to 3 and 5 to 11 connected to a load, in which flows a current in a random direction or an alternating current the relay being connected between two terminals of a diagonal of a four-diode rectifier bridge, a random direction current generator or an alternating current voltage generator being connected in series with the load between two other terminals of another diagonal of the rectifier bridge.

* * * * *